United States Patent [19]
Bluck et al.

[11] Patent Number: 6,101,972
[45] Date of Patent: Aug. 15, 2000

[54] PLASMA PROCESSING SYSTEM AND METHOD

[75] Inventors: Terry Bluck; James H. Rogers, both of Santa Clara County; Jun Xie, Sunnyvale, all of Calif.

[73] Assignee: Intevac, Inc., Stanta Clara, Calif.

[21] Appl. No.: 09/235,943

[22] Filed: Jan. 22, 1999

Related U.S. Application Data

[63] Continuation-in-part of application No. 09/076,971, May 13, 1998.

[51] Int. Cl.$^7$ .................................................... H05H 1/00
[52] U.S. Cl. ............................... 118/723 MP; 118/723 E; 118/723 ER; 118/723 HC; 156/345
[58] Field of Search ......................... 118/723 ER, 723 E, 118/723 HC, 723 MP; 156/345; 204/298.26, 298.14, 298.34, 298.06, 298.41

[56] References Cited

U.S. PATENT DOCUMENTS

| | | | |
|---|---|---|---|
| 4,183,797 | 1/1980 | Kennedy et al. | 204/192 R |
| 4,500,407 | 2/1985 | Boys et al. | 204/298.25 |
| 5,427,668 | 6/1995 | Sato et al. | 118/723 HC |
| 5,558,751 | 9/1996 | Mahler et al. | 204/298.26 |

OTHER PUBLICATIONS

Y. H. Lee, P. D. Richard, K. J. Bachman & J. T. Glass, "Bias–controlled chemical vapor deposition of diamond thin films"; Appl. Phys. Lett. 56 (7), Feb. 12, 1990, 620–22.

H. Li, M.Mecray, W. Yarbourgh, & X. H. Wang, "The Growth of Diamond Films using a DC–biased hot filament"; New Diamond Science & Technology, 2nd International Conf..

Washington, D.C. Sep. 23–27, 1990, p.461–466 N. Fujimori et al. Deposition of Diamond by Hot Filament and DC–Plasma Co–enhancement CVD; Diamond & Diamond like Films Electrochemical Soc. Proc. vol. PV 89–12, p465–474.

M.Weller et al., "Preparation and properties of highly tetrahedral hydrogenated amouphous carbon"; Physical Review B vol. 53 No. 3.

*Primary Examiner*—Thi Dang
*Attorney, Agent, or Firm*—Stanley Z. Cole

[57] ABSTRACT

A substrate processing system includes a processing chamber, a substrate holder positioned in the chamber, a gas source for supplying a process gas to the chamber, at least one ion source located in the chamber, and a power source for energizing the ion source by positively biasing the anode and negatively biasing the cathode, the bias in each instance being relative to the chamber. The ion source ionizes the process gas producing ions for processing a substrate disposed on a substrate holder in the chamber. One embodiment includes two such ion sources. In this case, the power source energizes the first and second anodes and the cathodes in a time multiplexed manner, such that only one of the first or second ion sources is energized at any time and interactions between ion sources are eliminated.

30 Claims, 4 Drawing Sheets

PLASMA PROCESSING SYSTEM AND METHOD

This invention is a continuation in part of a pending application filed May 13, 1998, entitled Processing System with Dual Ion Source, Ser. No. 09/076,971.

FIELD OF THE INVENTION

This invention relates to systems and methods for processing substrates, either single sided or two-sided, using plasmas created through generated ions and, more particularly, to processing systems and methods to deposit coatings on substrate surfaces.

BACKGROUND OF THE INVENTION

Commercial plasma sources are used for both deposition onto and etching from surfaces for a wide variety of industrial applications, especially semiconductor, optical, and magnetic thin film processing. The plasma formed by such sources generates reactive neutral and ionic species which can chemically and/or physically interact with surfaces to deposit or remove material.

In many processes, the use of energetic ions from plasma sources can result in the deposition of materials with unique properties or allow the etching of surfaces under conditions which would not otherwise be effective. A method for processing substrates in a plasma can include an ion source mounted in a vacuum chamber in which the substrate is present. A gas with specific chemical properties is supplied to the ion source for ionization. The plasma generated is a mixture of various reactive neutral and ionic chemical species as well as energetic electrons. The energy of the ionic species interacting with the surface depends upon plasma electrical properties and pressure. Typically, the energy of ions bombarding the substrate is controlled by means of the substrate bias. Alternatively, if the substrate is electrically floating, the ion energy will be determined by the electron energy distribution which determines the difference between the plasma potential and the potential at the surface for which there is zero net current (floating potential). Control of ion energy is desirable since deposition or etching process characteristics and resulting material properties often depend strongly on this parameter.

In some applications, it is desirable to process both sides of a substrate simultaneously. This is typical in the deposition of thin layers of various materials in the manufacture of magnetic hard disks used in magnetic memory systems. In this case, ion sources are positioned on opposite sides of the disk. However, ion sources which utilize an anode for establishing a plasma potential tend to exhibit plasma instability and oscillation when two such sources are operated simultaneously in a processing chamber. Such unstable behavior does not permit predictable ion generation and process stability. Also, it has proven difficult to coat thin films with properties which will satisfy the requirements of a protective film on a hard disk, for example, for computer memory applications. Thinner coatings in such a case permit the head to fly closer to the magnetics of the disk as to permit an increase in areal density. In depositing overcoatings, the coating should have sufficient hardness, density, and adhesion as well as practical qualities in the finished disk, including high deposition rates and low numbers of macroscopic particles on the surface. Accordingly, there is a need for improved substrate processing systems and methods wherein ion sources may operate in a stable manner in a processing chamber and wherein the properties of the deposited layers may be improved for their intended purpose.

These same practical requirements set the standards for single sided coating as well. For example if a protective coating is desired for an optical substrate, uses of the disk require that coatings that are deposited be deposited with the desired hardness, density and adhesion at a high rate while extremely thin and that variations through the presence of varying particles be minimized.

SUMMARY OF THE INVENTION

According to a first aspect of the invention, a novel substrate processing system is provided. The substrate processing system comprises a processing chamber, a substrate holder positioned in the chamber, a gas source for supplying a process gas to the processing chamber, at least one ion source located in the processing chamber and a power source for applying voltages to the ion source or sources (in the event more than one source is present), and to also energize other surfaces of the chamber. Each ion sources ionizes the process gas to produce ions for processing a substrate disposed on the substrate holder. Each ion source has a cathode and an anode. The power source energizes the one or more cathodes of the ion source or sources as well as the one or more anodes. In the event that more than one anode is being used, the power source energizes the ion sources in a time multiplexed manner such that only one of the anodes is energized at any time.

Biasing of elements may also be used in accordance with this invention to selectively control the energy of the ions from the ion source that reach and interact with particular surfaces. For example, by biasing the elements of the ion source one can create higher energy ions for deposition at the substrate and lower energy ions for deposition on the chamber walls. Thus this invention enables a predetermined control of the type of deposition at a surface and permits selectivity as to properties of the film deposited.

In particular, when forming diamond like carbon (DLC) from a plasma containing a hydrocarbon gas such as ethylene, carbon deposited on the walls with low energy ions (<100 eV) will exhibit much lower stress than carbon formed on the substrate with more energetic ions (180–200 eV). As the carbon on the wall builds up, the lower stress will make it less likely to flake, and lower levels of small particles will be present on the surface of the substrate being coated. Although in this example the layer deposited on the substrate may exhibit higher stress then the deposited carbon on the wall, this is not a problem for the system because the deposited layer is so thin and the hard deposited surface acts as a most effective protective coating for the layers below.

Thus thin layers of DLC coatings can be deposited as protective coatings on one or both sides of magnetic or other media (optical for example) with superior results compared to sputtered carbon films. In this instance the deposited layers, deposit as hard protective layers with sufficiently low numbers of small particles to minimize disk rejections in the manufacturing process resulting from "glide" or "certification" yield tests typically used by manufacturers to determine whether satisfactory and saleable disks have been made. In the event that a disk fails to pass such tests the manufacturer may be obliged to discard the disks reducing output and profitability. The current invention considerably reduces these problems.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
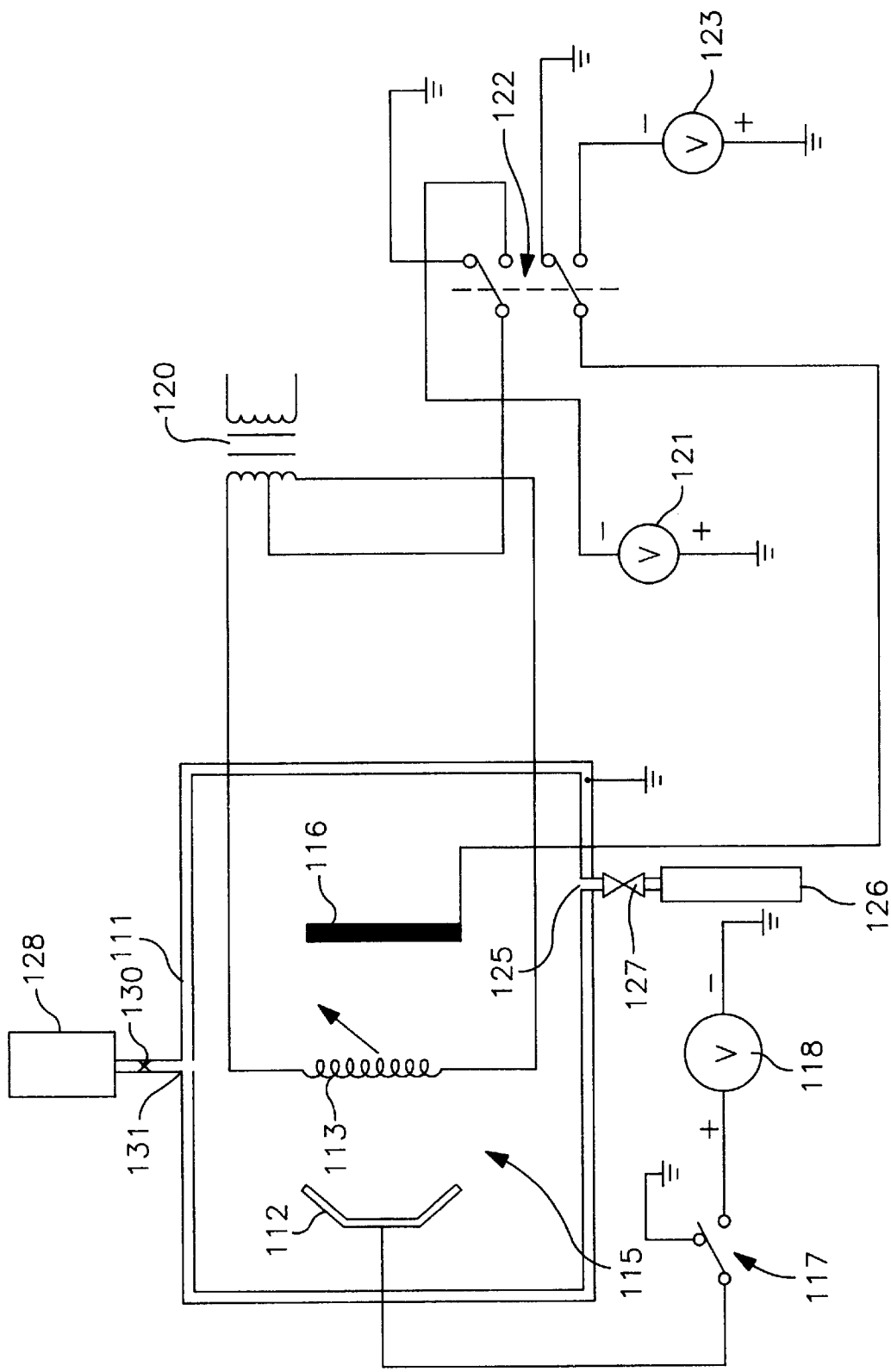
FIG. 1 is a schematic drawing of a single sided deposition system in accordance with this invention

The schematic shown in FIG. 1 represents a system to deposit materials on one side of a substrate which constitutes an embodiment of the invention which will also be used to explain the underlying principles of operation of the present invention. In particular, a chamber 111 houses an anode 112 and a filament 113. The combination of filament 113 and anode 112 together comprise an ion source generally shown as 115. Positioned also within chamber 111 is a substrate 116 facing ion source 115. The chamber 111 is grounded. The anode 112 is connected through anode switch 117 to anode power supply 118. Switch 117 is illustrated as connected to ground in FIG. 1. Connected to filament 113 is filament power supply 120. Filament bias supply 121 is connected through bias switch 122 through filament power supply to filament 113. In the embodiment illustrated, the bias supply biases the filament at ground. When bias switch 122 is thrown to its other position, filament 113 is biased from filament bias supply 121. Substrate 116 which may be positioned in a substrate holder (not shown in FIG. 1 but illustrated in FIG. 2) is illustrated in position if FIG. 1. Substrate 116 is biased from substrate bias supply 123 when bias switch 122 (ganged to close circuits to each of the filament 113 and the substrate 116 or alternatively to the substrate holder on which substrate 116 is positioned) is thrown to its other position.

In operation the chamber walls remain grounded. This assures that the equipment illustrated in FIG. 1 does not become dangerous in its natural environment. When it is desired to operate the equipment switch 117 and switch 122 are closed to connect the filament 113 to a bias potential and to connect the anode 112 to a bias potential. With the switches placed in this other positions voltage is supplied to the anode 112 from anode power supply 118 and to filament 113 from filament bias supply 121 through filament power supply 120. The anode when biased is raised to a positive voltage of between about 50 to 250 volts and preferably to about 80 volts. At the same time the voltage bias fed to the filament is between zero volts and about a negative 150 volts and preferably a negative voltage of about 120 volts. This creates a voltage difference between the filament and the chamber walls of less then about 100 volts. At the same time the substrate 116 voltage is taken to about the same voltage negative as the bias on the filament but the applied voltages may differ from these figures depending on various factors including the material being deposited and other conditions in the operating chamber as to generally create a potential difference between the filament 113 and the chamber walls 111 equal to the bias on the filament and a potential difference between the substrate and the anode of approximately 200 volts.

When the chamber is in an operating mode including the application of biases to the various operating components, a gas to create the plasma is fed into chamber 111 through gas port 125 from gas supply 126 when valve 127 is opened. A second gas supply 128, second valve 130 and second gas port 131 can be used to supply a second gas to the chamber 111.

During operation, the cathode or filament 113 is biased negatively relative to chamber 111. At the same time the anode is biased positively relative to the walls of the chamber 111. And, at the same time the substrate 116 is biased negatively with respect to the walls of chamber 111. This approach provides control of the energy of the ions reaching the substrate 116 and reaching the walls of chamber 111. This approach permits control of the properties of the film deposited on the walls of chamber 111 independently of the properties of the film deposited on substrate 116. In the embodiment being described, if a plasma containing a hydrocarbon is used supplied for example from gas supply 126, carbon would be deposited in films of different properties on the walls of chamber 111 and on substrate 116. The most important property in the case of DLC deposition, with respect to particle control, is the film stress. A low stress film is required on the walls of the chamber so that flaking does not occur and so that one can run the chamber for a reasonable period of time without the need for cleaning and/or creating a new vacuum environment. This can only be done if the deposition on the walls is of low stress material. At the same time there is deposited a high stressed thin film on the substrate 116 and this acts as a protective coating for the layers below. In this embodiment the ions striking the substrate do so with greater ion energy because of the potential difference existing between the anode of ion source 115 and the bias on substrate 116. At the same time ions of lower energy strike the walls of chamber 111 because of the lower potential difference between the anode and the walls as compared to the difference between the anode and the substrate.

For etch applications, this control scheme would allow for a reduction or elimination of etching of the walls of the chamber 111 by reducing the ion acceleration to the walls while etching on substrate 116. Alternatively etching can be used to clean up the walls or a shield positioned within the chamber adjacent to the walls. This is done using pure argon plasmas in the chamber. For other applications fluorocarbons or chlorine containing gases may be used. It is also possible to etch using oxygen or hydrogen as the processing gas.

The chamber for deposition is pumped down to about $10^{-7}$ torr. at the start of the cycle or prior to flowing gas into the chamber. During the time that both gases are flowing into the system, the pressure in the chamber rises generally to about 4 mtorr. It is preferred that the system be operated at about a chamber pressure of between about 1 and about 5 mtorr, but it is also possible to employ pressures in the range of 0.1 to 20 mtorr.

Although in connection with FIG. 1, the description included flowing gases from supply sources 128 and 126, the system can function by depositing only ions from the active gas which may, for example, be ethylene in the case of the deposition of carbon. In this case the other supply which for example may be argon is turned off using the control valve on that supply.

There are several requirements for a DLC protective overcoat for magnetic media. One is that the film be sufficiently hard that a very thin film, for example about 50 Angstroms, suffices and effectively protects the media. Another requirement is that sufficiently few particles are left on the substrate that a low flying head will not "crash" due to collisions with particles. We have found that operating at pressures greater than 3 mtorr, particle levels on the substrate are reduced. This may be due to a greater probability that large electrically charged particles will undergo charge exchange and become neutralized. On the other hand, if ethylene pressures are greater than about 2.3 mtorr, the DLC film becomes softer. This may be due to the energetic ions which strike the substrate surface transferring some of the energy to neutral ethylene molecules loosely bonded to the surface.

In order to obtain a hard film and low particle levels, we have found that we can add an inert gas such as Argon to the gas within the chamber. The reduction in particle levels is due to total gas pressure, apparently regardless of the composition of the gas. However, the film properties depend only on the partial pressure of the active gas, ethylene in this case, and are independent of the partial pressure of the inert gas, in this case Argon. Thus, we have achieved hard DLC films by operating at a partial pressure of ethylene of about 2 mtorr and at the same time obtain low particle levels by maintaining a partial pressure of Argon of 2 mtorr for a total pressure of 4 mtorr.

When both gases are flowing in a deposition mode in which carbon is to be deposited, ethylene gas will typically flow at a rate of about 14 sccm while argon will flow at a like rate but will be fed into the chamber from 2 sources, each providing about half the flow. Throughout the time gas is feeding into the chamber the vacuum system continues to operate.

Figure 2:
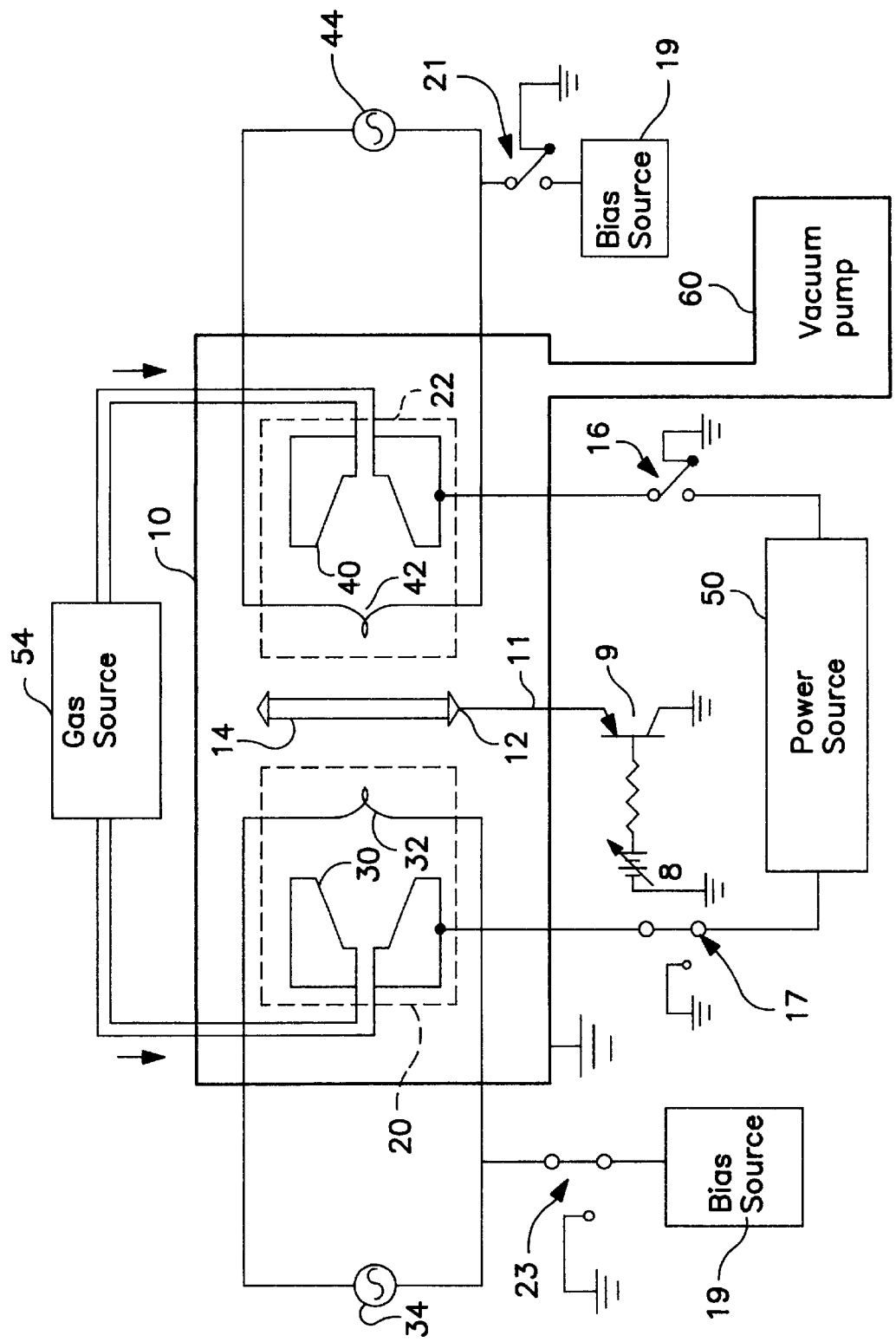
FIG. 2 is another schematic diagram, in this case, of a two-sided processing system in accordance with the invention.

Referring now to FIG. 2, there is shown an embodiment of the invention in which processing in accordance with the invention is on both sides of the substrate. This type of deposition would be used today in making magnetic memory disks for computer memory applications. The deposition process illustrated in this Fig. also controls the quality of material deposited on the walls of the chamber to minimize the deposition of unwanted particles on the surface of the substrate. In FIG. 2, there is shown an enclosed processing chamber 10, a substrate holder 12 having an electrical connection 11 to a bias voltage 8 through switch 9. Substrate holder 12 supports substrate 14 within processing chamber 10. Ion sources 20 and 22 are positioned on opposite sides of substrate 14. Processing chamber 10 is preferably conductive and is connected to ground. An electrical bias is applied to substrate 14 during processing if an aluminum disk or other conductive material is being used for fabrication, for example, of a magnetic hard disk. It is also possible to use other disk base materials such as glass, plastics or other light base materials to manufacture memory disks for use, for example, in small compact computers such as laptop units.

As in FIG. 1, a positive bias is applied to the anode relative to the grounded chamber. In the parent of this invention, the filament bias was maintained at ground. Plasma is produced by electron-neutral gas collisions, the electrons being supplied by the cathode or in this case the filament. The energy of the electrons emitted from the filament is determined by the voltage difference between the filament and the positively biased anode. The potential of the plasma is typically near the potential of the anode. In a typical operation, to create a plasma it is necessary to create an appropriate potential difference between the cathode and the anode. Thus while the two are at about the same potential, no plasma is created. However, with appropriate gases flowing through the system, or flowed into the system, and with an adequate potential difference between the cathode and anode, a plasma will be created at the ion source. A voltage difference of about 100 volts is required to achieve reliable plasma production. If one increases the anode voltage while the chamber is held at ground, one deposits, in the case of carbon, higher stress films on grounded surfaces. When higher stressed carbon deposits on the walls of the chamber it has been found that there results more particulate deposition on the surface of the substrate. Thus to lower the stress on the material deposited on the walls, one can operate at lower anode voltages. However, in order to create an adequate voltage difference to support a plasma of high energy and achieve depositions of highly stressed films on the substrate, the voltage applied to the cathode or cathodes is such that the cathodes are biased negatively with respect to ground. This places the walls of the chamber at a voltage bias between the extremes of the negative cathode and the positive anode. The net effect is more deposition on the substrate of highly stressed high energy ions because the substrate is also biased negatively during the deposition of lower stressed material on the walls of the chamber. Such lower stressed deposits, it turns out do not cause deposition of particulates on the substrate surface as much as is the case if higher stressed materials are deposited on the walls. Also in order to prevent or reduce arcing, the anodes in a two or more anode system, as is illustrated in FIG. 2, are pulsed alternately with a period of time between pulses during which neither anode is biased. During pulsing of the anodes, if an anode is at ground (not energized), the associated filament or cathode is also grounded for otherwise and depending on the voltage difference, the plasma could continue.

Ion source 20 includes an anode 30 and an electron source. The electron source may comprise a filament 32 positioned near anode 30. There is connected to the filament 32 a filament power supply 34. Ion source 22 includes an anode 40 and an electron source which comprises a filament 42 positioned near anode 40 and a filament power supply 44 connected to filament 42. Filament power supplies 34 and 44 electrically heat the respective filaments 32 and 42 for generation of electrons within the respective ion sources 20 and 22. Filaments 32 and 42 function as cathodes for the ion sources. Other electron sources, such as cold cathode electron sources, may be utilized within the scope of the invention. Anodes 30 and 40 are connected to a power source 50 through switches 16 and 17 so that the respective ion sources 22 and 20 may be energized as described below. Also connected to the filaments 32 and 42 is bias source 19 through switch 21 between bias source 19 and filament 42 and switch 23 between bias source 19 and filament 32.

A gas source 54 supplies a process gas to processing chamber 10. In particular, gas source 54 may supply gas to each of the ion sources 20 and 22 in the regions between anodes 30 and 40 and the substrate 14. Examples of suitable process gases include, but are not limited to, ethylene, methane and acetylene for the deposition of diamond-like carbon, mixtures of silane and ammonia for the deposition of silicon nitride, and argon, oxygen, or hydrogen for etching.

Gas is evacuated from chamber 10 by a vacuum pump 60 connected to the chamber. The gas source 54 and the vacuum pump 60 permit controlling the gas flow rate and the pressure in chamber 10, as has been discussed in connection with FIG. 1.

In operation, each of the ion sources 20 and 22 ionizes the process gas to form ions of the process gas. The ions are directed toward substrate 14 for deposition or etching. When the ion sources 20 and 22 are energized, a plasma is formed in processing chamber 10. The filaments 32 and 42 supply electrons for ionization of process gas molecules within the plasma. The ions are then accelerated across a plasma sheath at the substrate surface toward substrate 14. The processing system of FIG. 2 permits both sides of substrate 14 to be processed simultaneously.

It is also possible to carry out this process by generating plasmas using other equipment and techniques. For example, an appropriate gas may be passed through an area where electromagnetic energy is used to accelerate electrons to create a plasma which can then be fed to and biased by the anodes of the system.

As indicated above, instability and oscillation are observed when ion sources 20 and 22 are energized at the same time. The reason for such instability and oscillation is believed to be that the plasma within chamber 10 is a low impedance path for electrons generated by filaments 32 and 42. Therefore, when both ion sources are energized, the first plasma to be established creates a path of low resistance for all electrons and conducts electrons away from the other plasma source. Even if both plasma sources are able to operate, the plasma impedances do not match, thereby creating unbalanced electron sharing and oscillations. During normal operation of sources using hot filament electron sources, when a given anode is biased, all emitted electron current from the electron sources is collected by the one biased anode.

According to one aspect of the invention, ion sources 20 and 22 are energized in a synchronized, time multiplexed manner such that only one of the anodes is energized at any time. In particular, time multiplexed voltages may be applied to anodes 30 and 40 of the respective ion sources 20 and 22. The voltages applied to anodes 30 and 40 are non-overlapping in time, so that only one of the ion sources is energized at any time. The sources alternate on and off times, thus eliminating the interactions of the plasma electrons and ions between sources. The electrons are collected by one anode and then the other alternately. Synchronized, or time multiplexed, operation eliminates the need for complex shielding or grids to electrically isolate one plasma from the other.

The alternating voltages applied to anodes 30 and 40 preferably have frequencies less than about 100 kHz. In general, the frequencies of the anode voltages should be low in comparison with the reaction times of the ions in ion sources 20 and 22. This ensures that each ion source switches on and off rapidly in comparison with the on and off times of the anode voltages. In a preferred embodiment, the anode voltages have frequencies in a range of about 1 to 5 kHz.

At the time an anode is pulsed to a positive potential, the bias on the filaments are also pulsed or biased but in a negative direction. Also the substrate is biased at the same time in a negative direction. In this way the voltage difference between the filament and the anode is sufficient to create a high energy plasma and the substrate is sufficiently negative to cause deposition thereon of high energy ions from the plasma and thus an extremely hard surface is created which can provide protective coatings notwithstanding that the films deposited may be very thin. Yet the walls of chamber 10 having been grounded throughout the time that other elements in the system have been pulsed causes softer material depositions because the energy level to the walls is much lower because of the lower voltage differences and therefore lower energy ions deposit at that surface.

For a processing chamber having two ion sources, the duty cycles of the anode voltages are preferably less than 50% or less and are preferably equal. Unequal duty cycles may be utilized but would result in unbalanced processing of the two sides of substrate 14. The anode voltages are non-overlapping in time. The anode voltages (and thus the negative bias to the cathode) preferably each has a duty cycle of about 40%, such that both ion sources 20 and 22 are off during a portion of each cycle of the anode voltages.

A suitable power source 50 would be known to one skilled in the art. Sources are discussed and also shown in the parent application of this application and such disclosure and discussion is incorporated herein by reference. A power source which is used to apply power to all elements in the system requires appropriate controls and switches to assure correct biasing of anodes, cathodes and substrates in a proper time multiplexed fashion. Such elements to assemble such structures are known to the art.

Figure 3A:
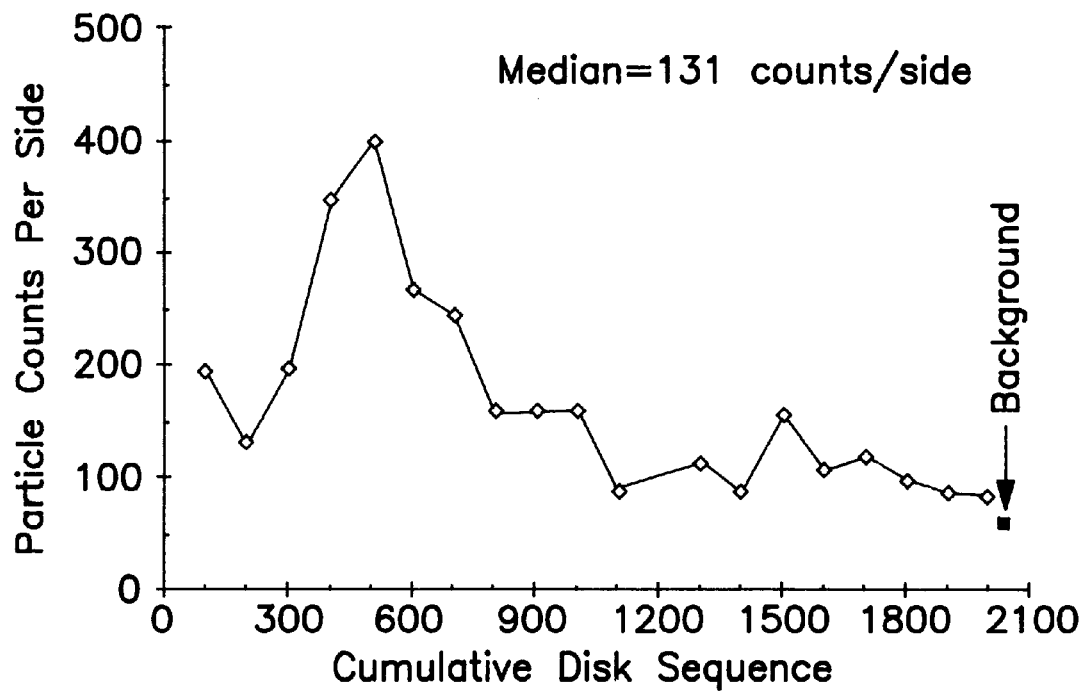
FIG. 3 is a graph showing particulates measured on the surface of the disks treated in two different voltage arrangements.

Reference is now MADE to FIG. 3 in which comparative graphs illustrate the effects of this invention. In FIG. 3A, there is shown a curve of particle data of an ion source during carbon deposition as practiced using multiplexed anodes and grounded filaments and walls, and biased substrates. Both surfaces of the substrate or disk were measured to find the typical of surface particle depositions. In particular, the data was gathered over about 7 hours. During each hour 290 substrates were coated continuously. These tests were run under conditions similar to those used for commercial manufacture of magnetic hard disks. Briefly, an NiP-plated aluminum substrate was pre-heated to about 200 degrees centigrade, layers of thin metal films of about 300 angstroms of chromium and 250 angstroms of cobalt alloy were deposited and thereafter the surface was coated with carbon films. Each of these process was done in a separate process chamber and the substrates were transferred from one chamber to another through a main chamber kept under a vacuum of approximately $10^{-7}$ torr to avoid contamination. Particles on a surface of the substrate were measured with a Tencor Surfscan 364D, which analyzes light scattered from particles illuminated with a spot laser of calibrated size and intensity. For every 100 substrates processed, one substrate was measured for particle counts (of particle sizes of 2 $\mu$m or greater) on each of its two surfaces and the average particle counts were plotted. In addition, particle counts from a background disk, that was not coated with ion source deposited carbon was also reported for purposes of comparison (see filled square). Particles from mechanical handling of the substrate, original substrate surface defects and particles generated by other process steps may contribute to such surface background counts. The key settings of the ion source used in these experiments were as follows: anode voltage=120 V, substrate bias=negative 80 volts, filament voltage=ground, shield potential=ground, cathode or filament emission=0.35 A, gasses and gas flowrate: $C_2H_4$ at 14 sccm (x2) and Ar=14 sccm, total pressure=4 mtorr, process duration=8 seconds. The ion source chamber liners (shields) of aluminum arc sprayed type were cleaned in situ with Ar plasma (at 3.0 mtorr) for 90 minutes. The data shows that, the number of particles observed on the substrate surface increased rapidly within one hour after the deposition started and reached its peak within 2 hours. The number of particles then slowly approached a steady level of approximately 100 counts/side. The median counts for the entire experiment was 131 per side. These particles on the substrate surfaces (additional over background) were later identified by using a scanning electron microscope and by energy dispersive x-ray spectroscopy to be carbon flakes that peeled off the ion source chamber liners, due to high stress of the ion source deposited carbon films. Furthermore, numerous experiments were preformed under similar conditions except for higher anode voltages (greater than 120V) and less substrate bias. It was found that the higher the anode voltage applied, the greater the initial peak of particle counts and the higher the eventual baseline particle count, indicating that particle generation is directly related to the carbon stress on the chamber wall or shield.

Figure 3B:
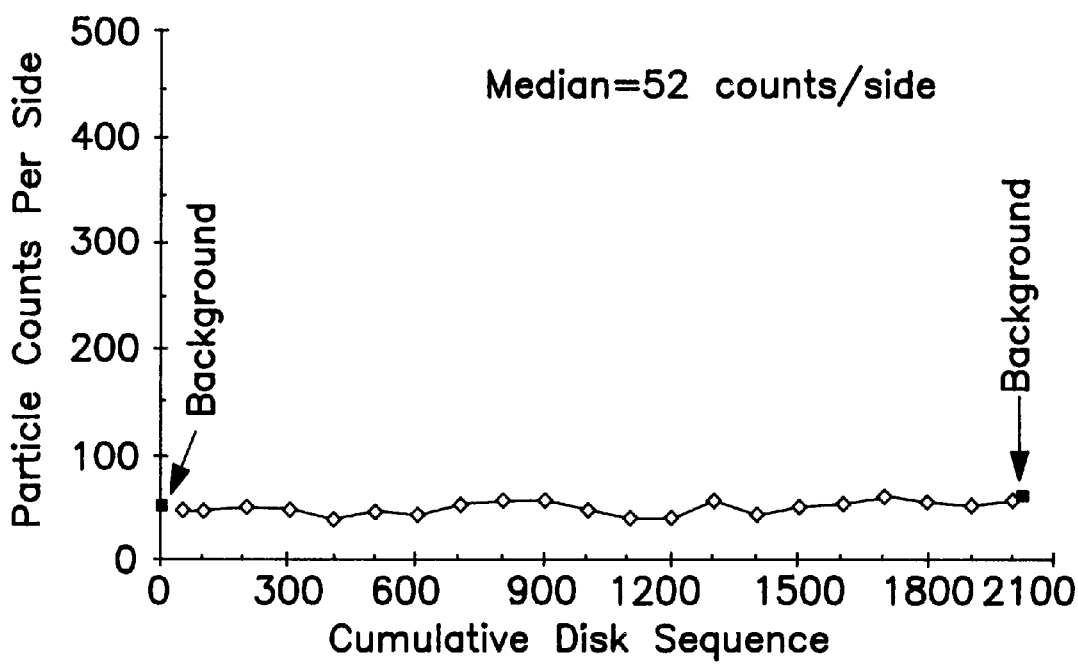

FIG. 3B shows typical data of particle generation during carbon deposition when the plasma system is run in accordance with this invention. Again the system was run for approximately 7 hours with a throughput of about 290 substrates per hour. The key settings of the ion source was anode at 50 to 100V, substrate bias negative 150 to 100 V, filament potential negative 150 to 100 V, shield potential at ground, filament emission at 0.50 A, gas and gas flow-rates: $C_2H_4$ at 14 sccm (x2) and Ar at 7 sccm (x2), total pressure in the chamber of 4 mtorr and process duration 8.0 seconds. Chamber walls or liners (shields) of aluminum arc-sprayed type, were cleaned in situ with Ar plasma at 3.0 mtorr for 60 minutes. For every 100 substrates processed three substrates were measured for particle counts of particle sizes of 2 $\mu$m or greater on both sides and the median particle counts per side were plotted (open diamonds). In addition particle counts from two background disks (one taken at the start and the other at the end), not coated with ion source deposited carbon, are shown for comparison purposes. These are the filled squares on the graph. This data shows that, the number of particles observed on the substrate surface remained at the background level (approximately 50 to 70 counts/side) over the 7 hour period of this experiment. The median counts per side for the entire experiment was only 52 per side, which is a significant improvement over the results illustrated in FIG. 3A. In an actual production environment, the background particle counts shown in these figures will be reduced through better substrate handling and preparation. It is the particles generated by the deposition process in situ that causes product failures and lower yields. Thus subtracting the background particle counts shows the significant improvement achieved in following the teachings of this invention as compared to the results achieved by the processes and methods of the parent application to this invention, In FIG. 4 the applied bias to the elements of the processing system are illustrated over time. As shown in this figure, the top curve illustrates the bias to the anode on side 1 of the substrate being coated. The middle graph illustrates the bias to the anode facing the second or other side of the substrate. Finally the lower graph illustrates the voltage applied to the disk or substrate such as the substrate 14 in FIG. 2 and also to the filaments such as filaments 32 and 42 in FIG. 2. As illustrated a positive bias is applied to the anodes when energized. Thus as shown a positive voltage is first applied to the anode facing side two of the substrate or disk being coated. Simultaneously the disk and filaments are biased negatively. These voltages, the filament biases, the negative bias on the disk or substrate and the positive bias on the anode facing side two of the disk are then all brought to ground. Thereafter, a positive voltage is applied to the anode facing side one of the substrate or disk and a negative bias is applied to the filaments. All of these applied biases are also brought to ground during the cycle time that the ion sources are not energized. This cycle continues during the periods the anodes are being energized. In general the cycle time for energizing each anode will comprise about 35 to 40 percent of the cycle time with the remaining 20 to 30 percent of the time during which the elements are all grounded.

Figure 4:
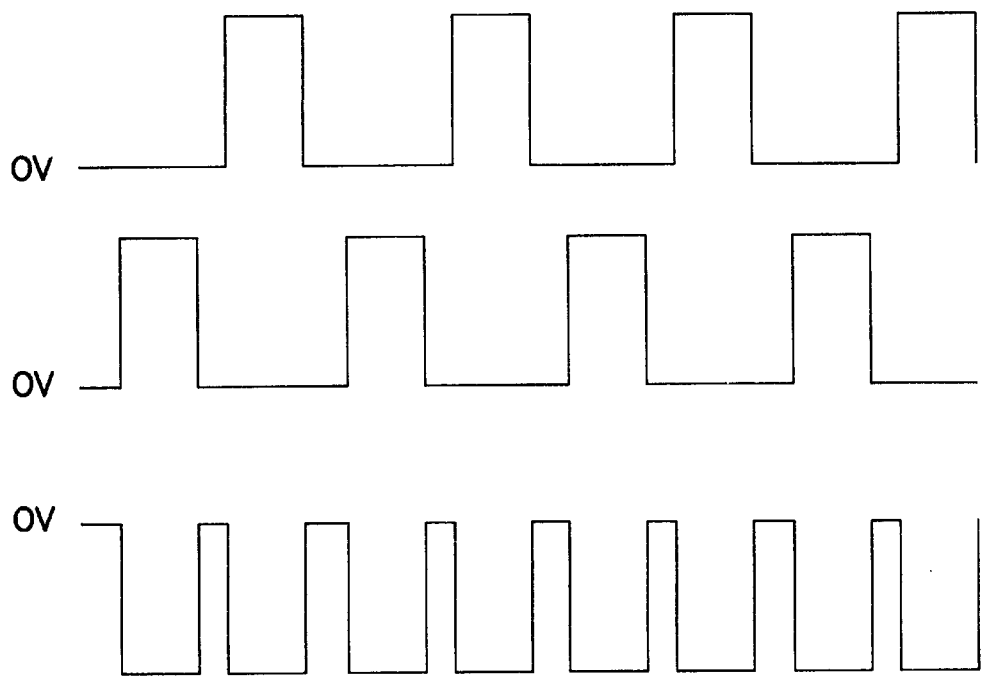
FIG. 4 is a graphical showing of the applied biases as a function of time in an embodiment as illustrated in FIG. 2; and, FIG. 5 is graphical showing of the changes of stress in films with changes in anode voltages.

In discussing the experiments to create the curves shown in FIG. 4, there was mentioned the use of a shield or liner.

Shields or liners are known to the art and are used in the semiconductor field. In this invention the shield or liner is used to prevent deposits on the chamber walls and to simplify chamber clean-up. Typically a liner may be used for a period of time such a about a week or even a longer period of time. It then can be easily removed from the chamber to clean the chamber. This is done rapidly and does not put the chamber out of use while a clean up of the walls takes place. Thus liners or shields are rapidly changed allowing the chamber to be pumped down without a long delay to clean the walls placing the system into operation more rapidly.

It has been found that preconditioning the chamber as through exposure of the chamber to a pure argon plasma for about an hour lowers the particle deposits on the surface of the substrate as disks are processed in the system. It is believed this type conditioning purifies the inside of the chamber or shield or liner being used in the chamber by removal of contaminants in the chamber or in liners associated with the chamber prior to operating the system to coat disks.

A processing system having one or two ion sources has been discussed thus far. The time multiplexed operation of ion sources as described in connection with FIG. 2, illustrated in FIG. 4, may be applied to processing systems having two or more ion sources. In each case, the ion sources are energized such that only one ion source is on at any time. For example, a processing system having four ion sources may be energized with non-overlapping anode voltages having duty cycles of 25% or less. The anode voltages applied to two or more ion sources depend on the number of ion sources, the desired duty cycle, the desired operating frequency and the type of structure or surfaces being treated. In each case, interaction between ion sources can be eliminated and depending on the other voltages applied, selectivity in deposition and selectivity in material qualities may be preselected and predetermined.

The voltage applied to the anodes can be varied from a low value determined by the minimum necessary to get significant ionization of the working gas (about 50 V), and a maximum determined by the onset of arcing on the grounded walls (typically >200 V difference between the anode voltage and the wall voltage). The number of particles on the surface of the substrate tends to increase with anode voltage and a greater difference of voltage between the anode and the wall, so the optimum anode voltage is generally the lowest voltage at which the required deposition rate, film properties, and reliable discharge onset can be obtained.

Controlling relative voltages allows control of the hardness and stress of the deposited film. This has particularly been found to be the case when depositing thin films of DLC simultaneously on both sides of the substrate. Further, we have found that for $V_a-V_s>120$ V produces very hard (>25 GPa) films with high stress (approx 3–4 Gpa); whereas, for $V_{a-s}$ of approximately 40 V, the films are much less hard (approx 9 Gpa) with low stress (<0.5 Gpa).

Figure 5:
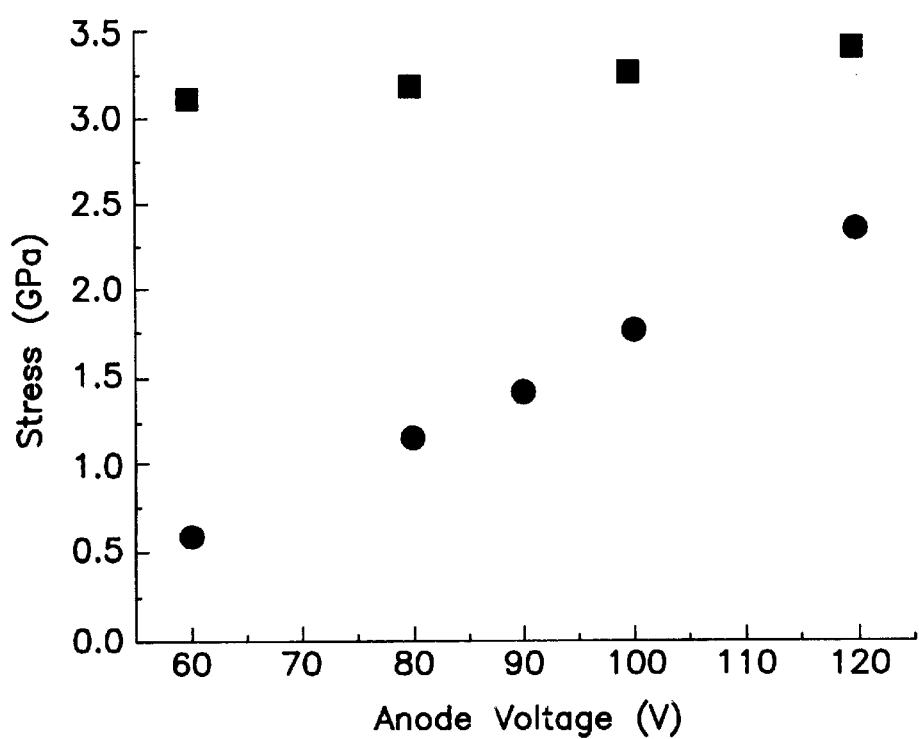

This is illustrated in FIG. 5, which shows the compressive stress of depositions on the walls and on the substrate or disk being coated in the system. In this case, as in the case of FIG. 4, the operating parameters were 2.3 mtorr pressure of $C_2H_4$, a 1.8 mtorr pressure of Ar and a 0.5 A filament emission. The wall or shield was at ground. The filament was biased to the same potential as the disk and both were varied so that they were maintained at 200 volts less than the anode voltage. Thus, if the anode voltage is 120 volts, then the disk and filament voltage is negative 80 volts. The blackened circles represent the GPa or stress of the deposits on the shield or walls of the chamber. The blackened squares represent the stress of the deposits on the substrate or the disk. The ion acceleration is approximately equal to the difference between the anode voltage and the voltage of the surface the ion impacts. Since the voltage difference between the anode and the substrate is kept constant, the ions impact the substrate with energy of about 200 eV. And, as the anode voltage is changed, since the voltage difference is kept constant the stress of the film is approximately constant. However, the walls remain at ground potential and thus the acceleration of the ions to the walls change from 60 eV to 120 eV and the stress of the carbon deposited on the walls changes significantly. When the stress of the carbon deposited on the walls is low (less than 2 Gpa) the carbon is less likely to flake, and lower particle levels are achieved on the substrate surface.

Although the mechanisms of the instant invention are not fully understood, it is presently believed that a plasma is formed, biased positively in reference to the grounded walls, and ions are accelerated across a sheath at the interface between the plasma and the biased substrate, in the event that the substrate is biased. Using a plasma rather than, for example, an ion beam, allows much higher deposition rates than otherwise possible. In this connection we have achieved deposition of protective overcoating layers in accordance with this invention at rates equal to or in excess of 15 Angstroms per second.

An advantage of the biased plasma approach over a grided ion beam source, a source that can be turned on and off, is that it is generally difficult to obtain high deposition rates at low ion energies because of space charge limits in acceleration grids. Also, the nature of the plasma sheath ensures that the ion acceleration is normal to the surface of the substrate over the entire surface area, whereas ion beams will have some divergence from normal incidence away from the axis of the substrate.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A substrate processing system comprising:
    a grounded processing chamber;
    a substrate holder positioned in said processing chamber;
    a gas source coupled to said processing chamber for supplying a process gas to said processing chamber;
    an ion source in said chamber for ionizing said process gas to produce ions for processing a surface of a substrate disposed on said substrate holder facing said ion source, said ion source comprising a first anode and a first electron source;
    a power source for biasing said anode, said electron source, and said substrate such that said anode and a substrate on said substrate holder are biased to a positive voltage level while said electron source is biased to a negative potential.

2. A substrate processing system as defined in claim 1 wherein a second ion source comprising a second anode and a second electron source is positioned facing the opposite surface of a substrate on said substrate holder and wherein said power source is adapted to apply a time multiplexed voltage to each of the first anode and said second anode.

3. A substrate processing system as defined in claim 2 wherein said power source comprises means for applying a pulsed, periodic voltage to each of said first anode and said second anode at a frequency of less than about 100 kHz.

4. A substrate processing system as defined in claim 2 wherein said power source comprises means for applying a pulsed, periodic voltage to each of said first anode and said second anode at a frequency that is less than a reaction time of a plasma in said chamber.

5. A substrate processing system as defined in claim 2 wherein said power source comprises means for applying a pulsed, periodic voltage to each of said first anode and said second anode at a duty cycle less than 50% and said electron sources are biased negatively during the time an anode is pulsed to a positive voltage.

6. A substrate processing system as defined in claim 2 wherein said power source includes means for applying a pulsed, periodic positive voltage to each of said anodes and a negative voltage to each of the electron sources of the first and second anodes at a duty cycle less than 50%, wherein said first ion source and said second ion source are both off during a portion of each cycle of the pulsed, periodic voltages.

7. A substrate processing system as defined in claim 1 wherein said gas source supplies $C_2H_4$ to said chamber.

8. A substrate processing system as defined in claim 2 wherein said gas source supplies ethylene and argon to said chamber.

9. A substrate processing system as defined in claim 2 wherein said power source comprises a power supply having a first and a second pulsed output, each said pulsed output coupled to said first and second anodes, respectively, and to said electron sources, wherein said first and second outputs comprise pulses that are phased shifted such that said first and second anodes are energized at different times and whereas said electron sources are energized when a pulsed output is applied to said electron sources.

10. A substrate processing system as defined in claim 2 wherein said processing gas is ethylene and the pressure in the chamber during the time gas is being fed into the chamber attains about 4 mtorr.

11. A substrate processing system as defined in claim 1 wherein said first and second electron sources each include a filament for generating electrons and a filament power supply coupled to said filament for heating said filament and applying a negative bias to said filaments.

12. A substrate processing system as defined in claim 3 wherein said power source comprises means for applying a pulsed, periodic voltage to each of the first anode and said second anode at a frequency in the range of about 1 to 5 kHz.

13. A substrate processing system as defined in claim 1 wherein said ion source generates ions of said process gas for etching said substrate.

14. A substrate processing system as defined in claim 2 wherein said ion sources generate ions of said process gas for etching said substrate.

15. A method for processing a substrate, comprising the steps of:
    positioning a substrate in a processing chamber;
    grounding said processing chamber;
    supplying a process gas to the processing chamber;
    ionizing said process gas with an ion source located in said chamber facing a surface of the substrate to produce ions of said process gas for processing the surface of the substrate, said ion source comprising an anode and an electron source; and
    applying a positive bias to said anode while applying a negative bias to the electron source and to said substrate.

16. A method as defined in claim 15 including supplying ethylene and argon gas as said process gas into said chamber.

17. A method as defined in claim 15 wherein said substrate is exposed at its other surface to at least a second ion source comprising at least a second anode and at least a second electron source and energizing the first anode and said second anode by applying pulsed, periodic positive voltages to each of the first and at least second anode and negative voltages to the first and at least said second electron source at a frequency in a range of about 1 to about 5 kHz.

18. A method as defined in claim 17 wherein the step of energizing the first anode and said second anode and their said electron sources comprises energizing the first anode and said second anode and said electron sources with first and second periodic voltages, respectively, that are out of phase.

19. A method as defined in claim 18 wherein said first and second periodic voltages have duty cycles of less than 50% and said first and second ion sources and the associated electron sources are both off during a portion of each cycle of the periodic voltages.

20. A method for operating two or more ion sources in a processing chamber, said two or more ion sources each having an anode and an electron source, comprising the step of:
energizing the anodes of said two or more ion sources in a time multiplexed manner such that only one of said two or more ion sources is energized at any time; and
simultaneously energizing to a negative bias potential the electron sources simultaneously with said anodes.

21. A substrate processing system comprising:
a processing chamber;
a substrate holder positioned in said processing chamber;
a gas for supplying a process gas to said processing chamber;
first and second anodes positioned in said processing chamber;
an electron source biased negatively in said chamber for producing electrons to said chamber for ionizing said process gas to produce ions for processing a substrate biased negatively disposed on the substrate holder; and
a power source for energizing with a positive bias relative to the chamber said first and second anodes and with a negative bias said electron sources and said substrate in a time multiplexed manner so that only one of said anodes is energized at any time.

22. A substrate processing system in accordance with claim 21 in which said substrate holder is electrically connected to the power source to facilitate biasing of a substrate in position on said substrate holder.

23. A substrate processing system in accordance with claim 2 in which said substrate holder is electrically connected to a power supply to permit biasing of a substrate in position on said substrate holder.

24. A method in accordance with claim 15 including positioning ion sources on different sides of said substrate.

25. A method in accordance with claim 24 including feeding process gas to each side of said substrate.

26. A processing system to deposit diamond like carbon on the two surfaces of a thin electrically conductive substrate at a processing station comprising:
a processing chamber;
a substrate holder positioned in said processing chamber;
a source of ethylene gas coupled to said processing chamber to feed gas into said chamber;
a power source and first and second plasma generators, each said plasma generator comprising an anode and an electron source positioned on a surface side of a substrate on said substrate holder to generate a plasma thereat;
said power source connected to said first and second plasma generators adapted to energize said plasma generators by applying a positive voltage to the anodes of said generators and a negative voltage to the electron sources thereof in a time multiplexed manner such that only one of said anodes of said plasma generators is energized at any one time; and
applying a negative voltage to said electron sources and said substrate while a positive voltage is applied to an anode of said plasma generators.

27. A substrate processing system comprising:
a processing chamber;
a substrate holder positioned in said processing chamber;
a gas source coupled to said processing chamber to supply process gases to said processing chamber;
a first plasma generator in said chamber connected to a power source for ionizing said process gas to produce ions for processing a substrate disposed on said substrate holder;
a second plasma generator in said chamber connected to a power source for ionizing said process gas to produce ions for processing a substrate disposed on said substrate holder; each of said plasma generators being disposed on opposite sides of the surfaces of a substrate on said substrate holder;
a power source for energizing in a time multiplexed manner such that only one of said generators is energized at any one time; and
an electrical source connected to said substrate holder to bias a substrate disposed on said holder for processing.

28. A substrate processing system in accordance with claim 24 in which a liner is positioned within the chamber and protects the walls of the chamber from deposits.

29. A substrate processing system as defined in claim 1 wherein said ion source generates ions of said process gas for etching the deposits on the surface of a shield in said chamber.

30. A substrate processing system in accordance with claim 27 in which the process gas comprises Argon.

* * * * *